(12) United States Patent
Takao

(10) Patent No.: US 11,075,180 B2
(45) Date of Patent: Jul. 27, 2021

(54) SEMICONDUCTOR DEVICE AND METHOD OF MANUFACTURING THE SEMICONDUCTOR DEVICE

(71) Applicant: AOI Electronics Co., Ltd., Takamatsu (JP)

(72) Inventor: Katsuhiro Takao, Marugame (JP)

(73) Assignee: AOI Electronics Co., Ltd., Takamatsu (JP)

( * ) Notice: Subject to any disclaimer, the term of this patent is extended or adjusted under 35 U.S.C. 154(b) by 139 days.

(21) Appl. No.: 16/493,338

(22) PCT Filed: Aug. 4, 2017

(86) PCT No.: PCT/JP2017/028390
§ 371 (c)(1),
(2) Date: Sep. 12, 2019

(87) PCT Pub. No.: WO2018/220868
PCT Pub. Date: Dec. 6, 2018

(65) Prior Publication Data
US 2021/0143113 A1    May 13, 2021

(30) Foreign Application Priority Data
May 30, 2017    (JP) .............................. JP2017-106608

(51) Int. Cl.
*H01L 23/48*    (2006.01)
*H01L 23/52*    (2006.01)
(Continued)

(52) U.S. Cl.
CPC .............. *H01L 24/05* (2013.01); *H01L 21/56* (2013.01); *H01L 21/78* (2013.01);
(Continued)

(58) Field of Classification Search
USPC ........................................................ 257/737
See application file for complete search history.

(56) References Cited

U.S. PATENT DOCUMENTS 9,496,195 B2    11/2016 Lin et al.
9,704,769 B2    7/2017 Strothmann et al.
(Continued)

FOREIGN PATENT DOCUMENTS

JP    2001-244281 A    9/2001
JP    2002-93830 A    3/2002
(Continued)

OTHER PUBLICATIONS

International Search Report (PCT/ISA/210) issued in PCT Application No. PCT/JP2017/028390 dated Oct. 17, 2017 with English translation (four (4) pages).
(Continued)

*Primary Examiner* — Niki H Nguyen
(74) *Attorney, Agent, or Firm* — Crowell & Moring LLP

(57) ABSTRACT

A semiconductor device includes a semiconductor element having a plated portion on a part of a main surface and a protective member that seals surfaces of the semiconductor element except for the main surface, wherein the plated portion is electrically connected to a circuit in the semiconductor element.

15 Claims, 6 Drawing Sheets

(51) Int. Cl.
*H01L 29/40* (2006.01)
*H01L 23/00* (2006.01)
*H01L 21/56* (2006.01)
*H01L 21/78* (2006.01)
*H01L 23/31* (2006.01)

(52) U.S. Cl.
CPC .......... *H01L 23/3185* (2013.01); *H01L 24/03* (2013.01); *H01L 24/11* (2013.01); *H01L 24/13* (2013.01); *H01L 2224/02206* (2013.01); *H01L 2224/03019* (2013.01); *H01L 2224/0401* (2013.01); *H01L 2224/13082* (2013.01); *H01L 2224/13139* (2013.01); *H01L 2224/13147* (2013.01)

(56) References Cited

U.S. PATENT DOCUMENTS

| | | |
|---|---|---|
| 2001/0018229 A1 | 8/2001 | Kato et al. |
| 2012/0228750 A1* | 9/2012 | Okumura ................ H01L 24/13 257/659 |
| 2012/0319254 A1 | 12/2012 | Kikuchi et al. |
| 2013/0026653 A1 | 1/2013 | Yamamichi et al. |
| 2013/0337608 A1 | 12/2013 | Kotani et al. |
| 2014/0091455 A1* | 4/2014 | Strothmann ............ H01L 24/12 257/734 |

FOREIGN PATENT DOCUMENTS

| | | |
|---|---|---|
| JP | 2009-272512 A | 11/2009 |
| JP | 2010-232648 A | 10/2010 |
| JP | 2012-109306 A | 6/2012 |
| WO | WO 2011/108308 A1 | 9/2011 |
| WO | WO 2011/118572 A1 | 9/2011 |
| WO | WO 2012/121377 A1 | 9/2012 |

OTHER PUBLICATIONS

Japanese-language Written Opinion (PCT/ISA/237) issued in PCT Application No. PCT/JP2017/028390 dated Oct. 17, 2017 with English translation (five (5) pages).

* cited by examiner

SEMICONDUCTOR DEVICE AND METHOD OF MANUFACTURING THE SEMICONDUCTOR DEVICE

TECHNICAL FIELD

The present invention relates to a semiconductor device and a method of manufacturing the semiconductor device.

BACKGROUND ART

Semiconductor devices in which terminals for external connection are directly mounted on a bare chip without internal wiring of bonding wires have been known. For example, PTL1 describes a semiconductor device having a structure in which bumps for external connection are provided on one surface of a bare chip and other surfaces are sealed with a protective resin.

CITATION LIST

Patent Literature

PTL1: Japanese Laid-Open Patent Publication No. 2001-244281

SUMMARY OF INVENTION

Technical Problem

In the conventional semiconductor device described in PTL1, the mounting terminals are formed of solder bumps. It is therefore difficult to control the thickness of the semiconductor device in its height direction.

Solution to Problem

A semiconductor device according to the 1st aspect comprises: a semiconductor element having a plated portion on a part of a main surface; and a protective member that seals surfaces of the semiconductor element except for the main surface, wherein: the plated portion is electrically connected to a circuit in the semiconductor element. A method of manufacturing a semiconductor device according to the 2nd aspect comprises: forming a plated portion on a part of a main surface of the semiconductor element, the plated portion being electrically connected to a circuit in a semiconductor element; and sealing surfaces except for the main surface of the semiconductor element, with a protective member.

Advantageous Effects of Invention

According to the present invention, the thickness in the height direction of the semiconductor device can be easily controlled.

BRIEF DESCRIPTION OF DRAWINGS

FIGS. 1A and 1B are schematic views of a semiconductor device according to a first embodiment, wherein FIG. 1A is a cross-sectional view of the semiconductor device and FIG. 1B is a plan view of the semiconductor device as viewed from a main surface side.

DESCRIPTION OF EMBODIMENTS

Hereinafter, a semiconductor device, a method of manufacturing the semiconductor device, and the like according to a first embodiment will be described with reference to the drawings as required. In the following embodiment, a surface of the semiconductor device on which an external connection terminal is provided is referred to as a main surface of the semiconductor device. Further, a direction perpendicular to the main surface is referred to as a vertical direction, and a direction outward from the main surface of the semiconductor device is referred to as upward (an upper direction). Moreover, in the following embodiments, a term "connect" includes a meaning that two objects connected to each other can conduct electricity.

First Embodiment

Figure 1A:
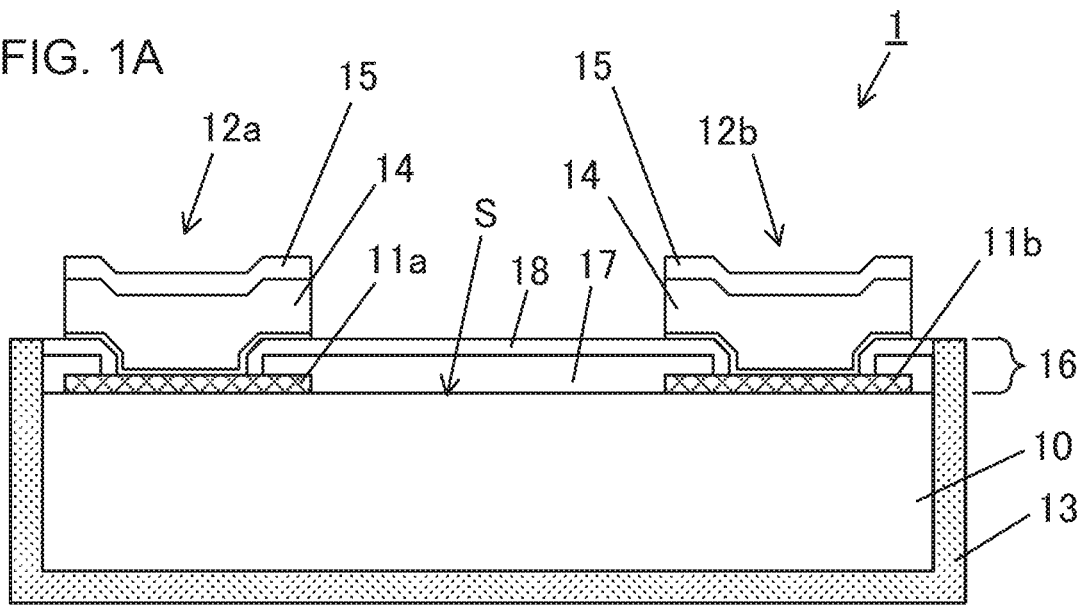
Figure 1B:
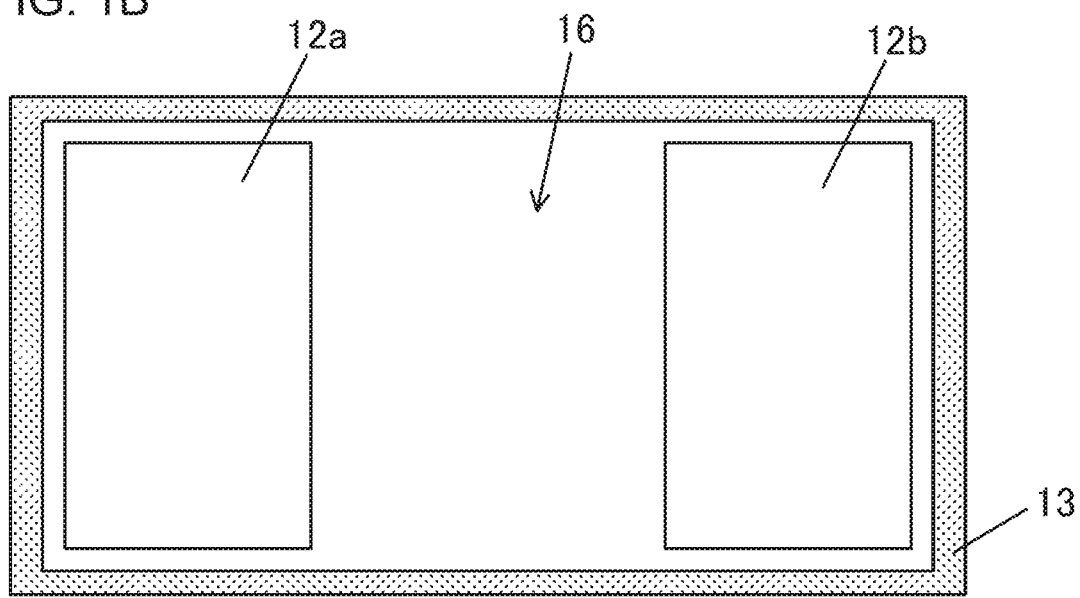

FIG. 1 is a schematic view of the semiconductor device according to the first embodiment of the present invention. FIG. 1(a) is a cross-sectional view of the semiconductor device 1 and FIG. 1(b) is a plan view of the semiconductor device 1 as viewed from the main surface side.

The semiconductor device 1 includes a semiconductor element 10, a pad 11a, a pad 11b, a mounting terminal 12a, a mounting terminal 12b, and a sealing resin 13. A terminal formation surface S of the semiconductor element 10 on which the pad 11a and the pad 11b are formed is the main surface. On the terminal formation surface S, the pad 11a and the pad 11b are arranged side by side. The mounting terminal 12a is provided over the pad 11a in the upper direction. The pad 11a is electrically connected to the mounting terminal 12a. A mounting terminal 12b is provided over the pad 11b in the upper direction. The pad 11b is electrically connected to the mounting terminal 12b.

In the following description, the pad 11a and the pad 11b are collectively referred to as pads 11. Similarly, the mounting terminal 12a and the mounting terminal 12b are collectively referred to as mounting terminals 12.

An insulating protective layer 16 is formed on a portion of the terminal formation surface S where the pads 11 are not formed. The insulating protective layer 16 insulates the semiconductor element 10 and protects the semiconductor element 10 from foreign matters and the like. The insulating protective layer 16 includes a passivation film 17 formed on the terminal formation surface S and a protective film 18 formed on the passivation film 17.

The mounting terminal 12 includes a first conductive layer 14 formed on the pad 11 and a second conductive layer 15 formed on the first conductive layer 14. The first conductive layer 14 is made of a conductor such as copper. The second conductive layer 15 is made of a conductor such as tin or silver.

The semiconductor element 10 is a bare semiconductor chip obtained by dicing a wafer which is a semiconductor substrate. The semiconductor element 10 is configured to include a single circuit such as a diode, or an electronic circuit such as an integrated circuit or a large scale integrated circuit. The pad 11a and the pad 11b are made of metal such as aluminum. The sealing resin 13 is a protective member that seals five surfaces of the semiconductor device 1, which has six surfaces, except for the terminal forming surface S where the mounting terminals 12 and the insulating protective layer 16 are provided.

Method of Manufacturing Semiconductor Device 1

Hereinafter, a method of manufacturing the semiconductor device 1 will be described with reference to FIGS. 2 to 5. The semiconductor device 1 is manufactured by sequentially performing steps 1 to 14 on a wafer 20 of a material.

Note that FIGS. 2 and 3 show only a region corresponding to one semiconductor device 1 among a large number of semiconductor devices 1 formed on the wafer 20. In practice, a large number of semiconductor device formation regions are formed on the wafer 20. In each semiconductor device formation region, the semiconductor device 1 shown in FIGS. 2 and 3 is to be formed.

Figure 2A:
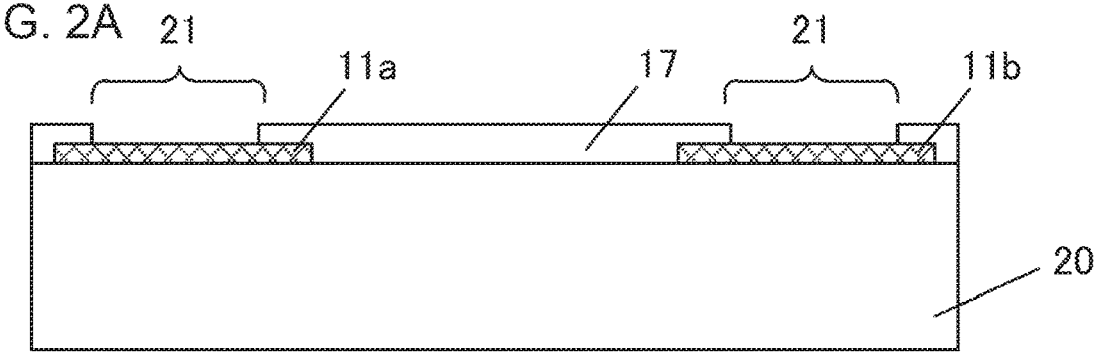
FIGS. 2A to 2D are cross-sectional views for explaining a method of manufacturing the semiconductor device.

As shown in FIG. 2(a), the pad 11a and the pad 11b are formed on the wafer 20 by a method such as vapor deposition. A passivation film 17 is formed over the pad 11 on the terminal formation surface S of the wafer 20 on which the pad 11 is formed.

An opening 21 is formed in the passivation film 17 in a region over the pad 11. The pad 11 is exposed from the opening 21 of the passivation film 17.

Step 1

Figure 2B:
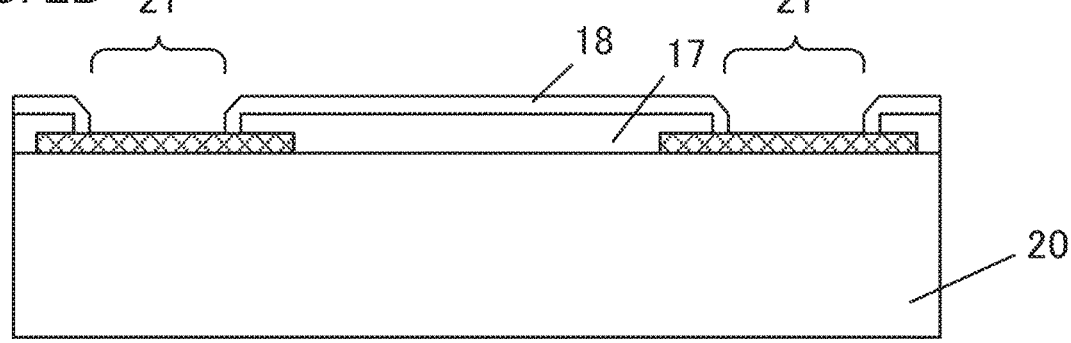

In step 1, the wafer 20 is coated with polyimide. A polyimide resin is applied on the wafer 20 shown in FIG. 2(a). The polyimide resin is then exposed using a photomask having a predetermined pattern formed therein, developed, and cured. As a result, the wafer 20 is configured as shown in FIG. 2(b). In FIG. 2(b), a protective film 18 made of the polyimide resin has been formed on the passivation film 17. The thickness of the protective film 18 is approximately 5 micrometers, for example. The protective film 18 is not formed over the opening 21.

Step 2

Figure 2C:
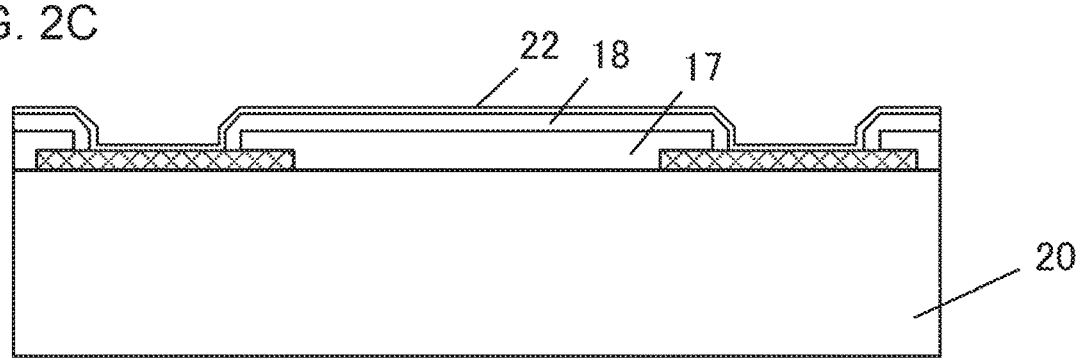

In step 2, a seed layer 22 for electroplating is formed. The seed layer 22 is formed on the pad 11 and the protective film 18 shown in FIG. 2(b) by sputtering or the like. The seed layer 22 is a thin film that functions as a UBM (Under Bump Metallurgy). The seed layer 22 is made of titanium (Ti) as an adhesion layer, and copper (Cu) on the adhesion layer, for example. As a result, the wafer 20 is configured as shown in FIG. 2(c). In FIG. 2(c), the seed layer 22 has been formed on the protective film 18 and the opening 21.

Step 3

Figure 2D:
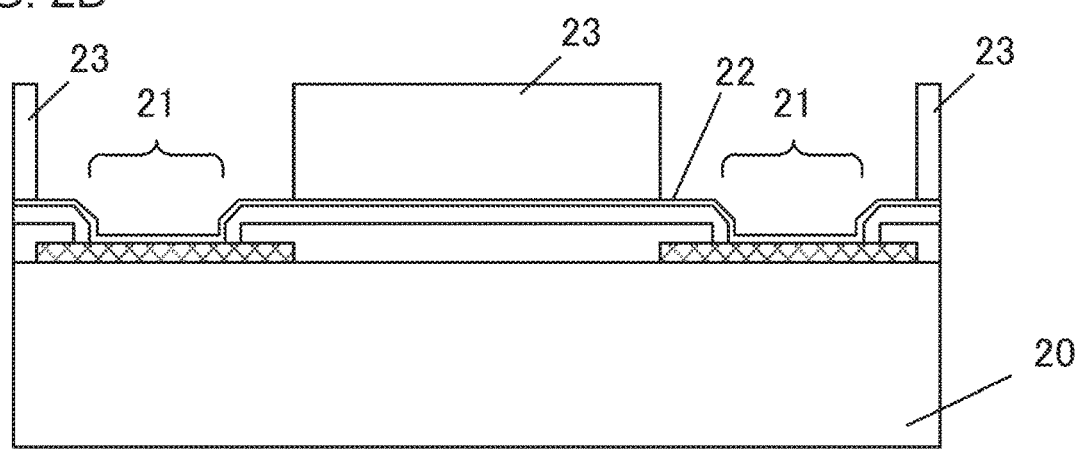

In step 3, a plating resist 23 is formed. A plating resist is applied on the seed layer 22 shown in FIG. 2(c). The plating resist is then exposed using a photomask having a predetermined pattern formed therein and developed. As a result, the wafer 20 is configured as shown in FIG. 2(d). In FIG. 2(d), the plating resist 23 has been formed on the seed layer 22. The plating resist 23 is not formed on a portion where the mounting terminals 12 are to be formed, that is, over the opening 21.

Step 4

Figure 3A:
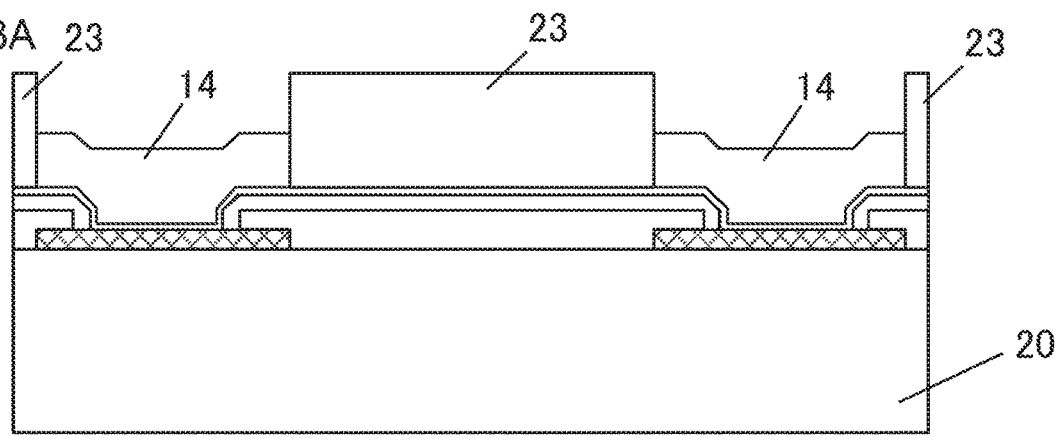
FIGS. 3A to 3D are cross-sectional views for explaining a method of manufacturing the semiconductor device, subsequent to steps in FIG. 2.

In step 4, a first conductive layer 14 of the mounting terminal 12 is formed. The first conductive layer 14 is formed by electroplating on a portion where the plating resist 23 shown in FIG. 2(d) is not formed. The first conductive layer 14 is made of copper, for example. As a result, the wafer 20 is configured as shown in FIG. 3(a). In FIG. 3(a), a part of the mounting terminal 12, that is, the first conductive layer 14 has been formed over the opening 21.

Step 5

Figure 3B:
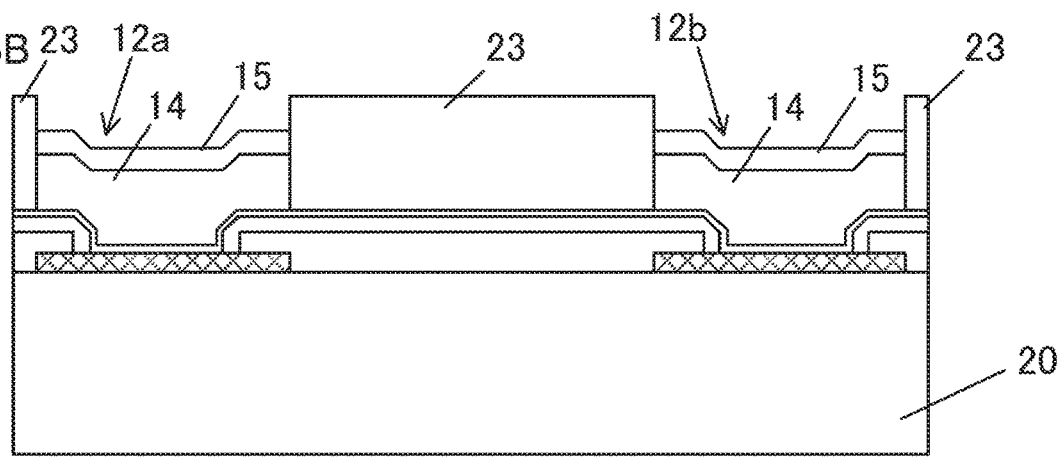

In step 5, a second conductive layer 15 of the mounting terminal 12 is formed. The second conductive layer 15 is formed by electroplating on the first conductive layer 14 shown in FIG. 3(a). The second conductive layer 15 is made of metal containing tin and silver, for example. As a result, the wafer 20 is configured as shown in FIG. 3(b). In FIG. 3(b), the mounting terminal 12 including the first conductive layer 14 and the second conductive layer 15 has been formed over the opening 21. Note that the thickness of the mounting terminal 12 as viewed from a surface of the insulating protective layer 16 is desirably 15 micrometers or less in order to reduce a mounting thickness of the semiconductor device 1. For example, such a thickness can be realized with the thickness of the first conductive layer 14 of approximately 8 micrometers and the thickness of the second conductive layer 15 of approximately 3 micrometers.

Step 6

Figure 3C:
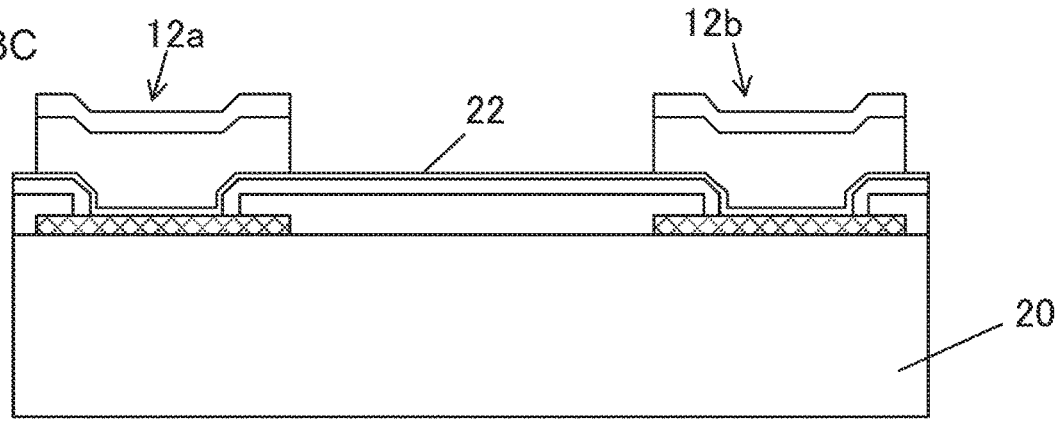

In step 6, the plating resist 23 is removed. Since the first conductive layer 14 and the second conductive layer 15 shown in FIG. 3(b) have been formed, the plating resist 23 is unnecessary and is thus removed. As a result, the wafer 20 is configured as shown in FIG. 3(c). In FIG. 3(c), the plating resist 23 formed on portions where the mounting terminal 12a and the mounting terminal 12b are not located has been removed.

Step 7

Figure 3D:
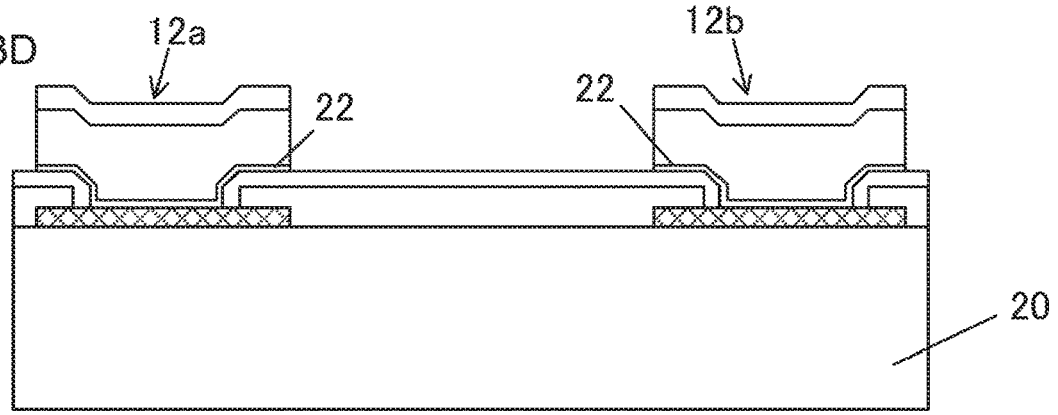

In step 7, the exposed seed layer 22 is removed. The exposed seed layer 22 is removed by etching so that the mounting terminals 12 shown in FIG. 3(c) are isolated from each other. As a result, the wafer 20 is configured as shown in FIG. 3(d). In FIG. 3(d), the exposed seed layer 22, which existed between the mounting terminal 12a and the mounting terminal 12b, has been removed.

Figure 4A:
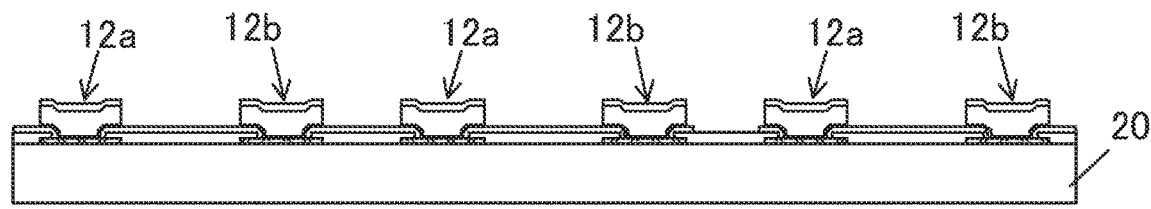
FIGS. 4A to 4D are cross-sectional views for explaining a method of manufacturing the semiconductor device, subsequent to steps in FIG. 3.

FIG. 4(a) shows a part of the wafer 20 that has been subjected to the above-described steps 1 to 7. Note that FIGS. 4 and 5 schematically show regions corresponding to three semiconductor devices 1 in the entire wafer 20.

Step 8

Figure 4B:
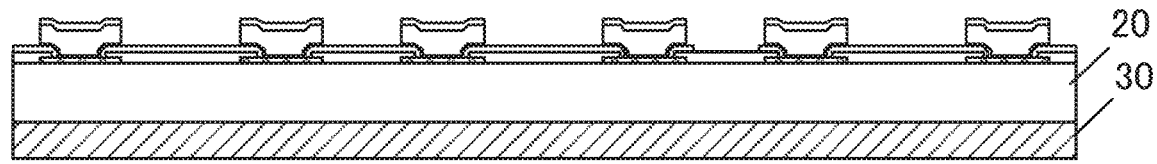

In step 8, back-grinding and attaching to a dicing tape is performed. By back-grinding, the wafer 20 is removed and thinned from the bottom surface side, which is opposite to the main surface, to a predetermined thickness. Thereafter, the bottom surface of the wafer 20 is attached to the dicing tape 30. As a result, the wafer 20 is configured as shown in FIG. 4(b). In FIG. 4(b), the dicing tape 30 has been attached to the surface of the wafer 20, namely, the bottom surface that is opposite to the main surface on which the mounting terminals 12 are formed.

Step 9

Figure 4C:
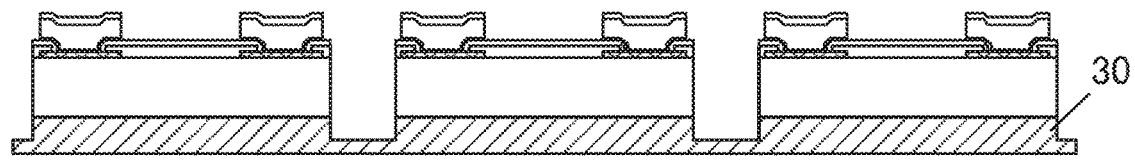

In step 9, dicing of the semiconductor device 1 is performed. That is, the wafer 20, together with the protective film 18 and the passivation film 17, is cut from the upper side along boundaries between regions (semiconductor device formation regions) in which the semiconductor devices 1 are formed. The cutting is performed to the middle of the thickness of the dicing tape 30. By cutting the wafer 20, the regions having a large number of semiconductor devices 1, which are to be obtained from the wafer 20, are separated from one another. As a result, the wafer 20 is configured as shown in FIG. 4(c). In FIG. 4(c), individual wafer pieces separated from one another are adhered to the dicing tape 30.

Step 10

Figure 4D:
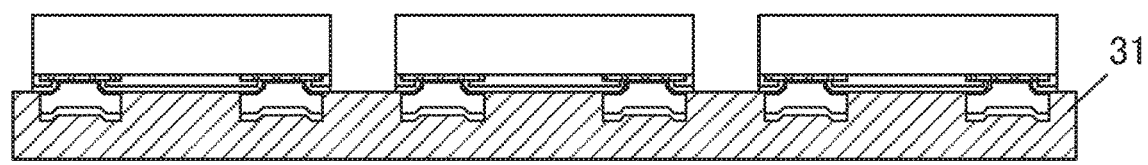

In step 10, a tape is again attached. A support tape 31 is attached to the wafer 20 to cover the terminal formation surface S of the wafer 20, and then the dicing tape 30 attached to the bottom surface of the wafer 20 is peeled off. As a result, the wafer 20 is configured as shown in FIG. 4(d). In FIG. 4(d), the mounting terminals 12 have been buried in the support tape 31. A surface 16a of the insulating protective layer 16 is in contact with a surface of the support tape 31.

Step 11

Figure 5A:
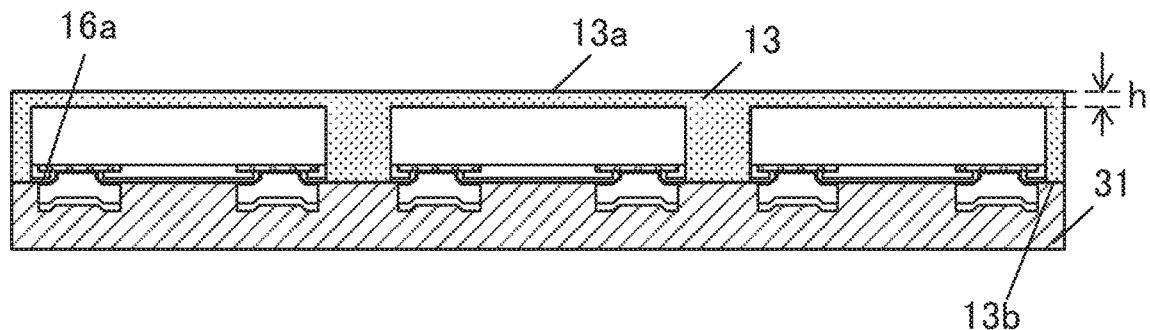
FIGS. 5A to 5D are cross-sectional views for explaining a method of manufacturing the semiconductor device, subsequent to steps in FIG. 4.

In step 11, resin sealing is performed. For example, five surfaces except for the terminal formation surface S having the support tape 31 attached thereto are sealed with the sealing resin 13 by vacuum lamination. For example, the wafer 20 is covered with a film-like thermosetting resin, and heated at 120° C. to 150° C. with an applied pressure of 0.5 MPa under a vacuum of 1 hPa or less. As a result, as shown in FIG. 5(a), the wafer 20 is filled with the sealing resin 13 between the separated semiconductor device formation regions (wafer pieces), and one surface 13a of the sealing resin 13 becomes flat. That is, in FIG. 5(a), the wafer pieces once separated in step 9 have been again fixed together by the sealing resin 13. Further, since the resin sealing is performed while the surface 16a of the insulating protective layer 16 is in contact with the surface of the support tape 31, a surface 13b of the sealing resin 13 in contact with the support tape 31 becomes flush with the surface 16a of the insulating protective layer 16.

Note that the thickness h of the sealing resin 13 on a surface (upper surface) of the wafer 20 is desirably 30 micrometers or less in order to further reduce the thickness of the semiconductor device 1. Additionally, the sealing resin 13 desirably contains a filler in order to reliably seal between the wafer pieces with the sealing resin 13. Microsized or nano-sized fillers dispersed in the resin enhance strength, heat resistance, flame retardancy, insulation properties, and facilitate thinning and planarization.

Here, pressing may be performed to planarize the surface 13a of the sealing resin 13. When the thickness of the upper surface of the sealing resin 13 has a certain amount or more, a roughness on the upper surface of the sealing resin 13 may occur. However, this pressing allows the upper surface of the sealing resin 13 to be planarized.

Step 12

Figure 5B:
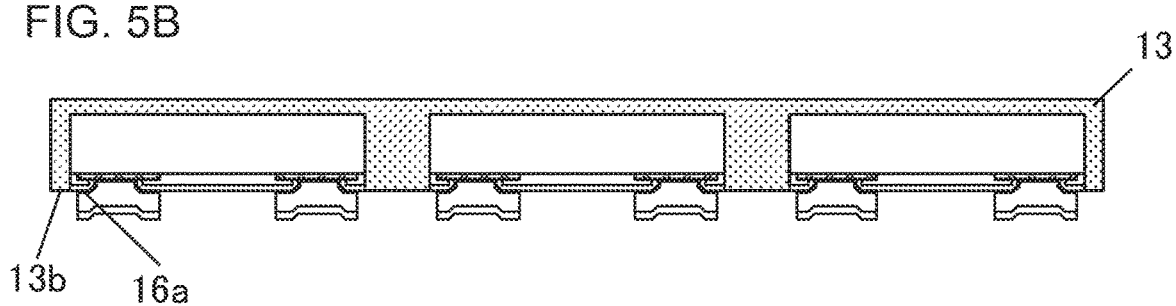

In step 12, each of the wafer pieces integrated with the sealing resin 13 is peeled off from the support tape 31. In a case where the support tape 31 has a property of reducing its adhesive strength by heating, the support tape 31 is desirably peeled off while heating. After peeling off the support tape 31, post-curing is performed as required to fix the sealing resin 13. In a case where post-curing is performed after peeling off the support tape 31, it is not necessary to consider thermal characteristics of the support tape 31. If the support tape 31 has a high heat resistance, post-curing may be performed before peeling off the support tape 31. As a result, the wafer 20 is configured as shown in FIG. 5(b). In FIG. 5(b), the surface 13b of the sealing resin 13 in contact with the support tape 31 and the surface 16a of the insulating protective layer 16 are continuously formed and are flush with each other, as described above.

Step 13

Figure 5C:
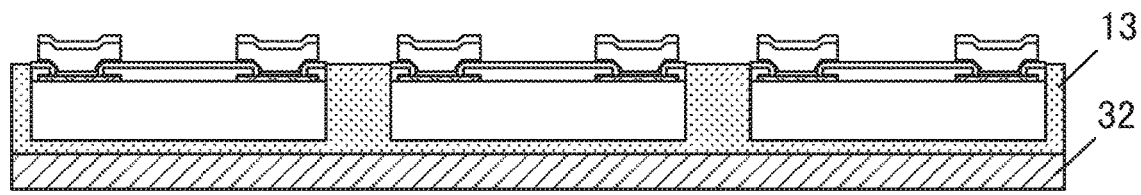

In step 13, a dicing tape 32 is attached to a surface of the wafer 20. As a result, the wafer 20 is configured as shown in FIG. 5(c).

Step 14

Figure 5D:
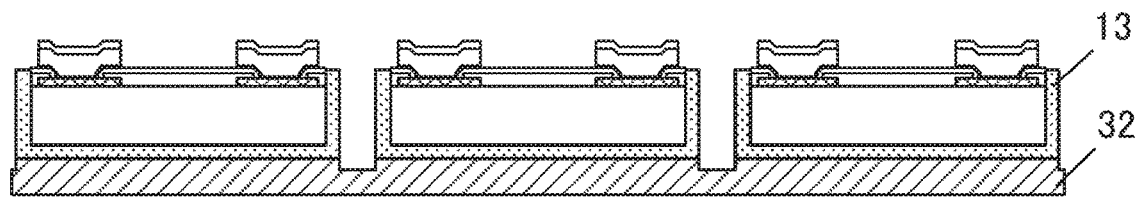

In step 14, dicing is performed. The sealing resin 13 filled between the wafer pieces is cut and removed, leaving a required thickness of the sealing resin 13 from peripheral side edges of each wafer piece. As a result, the wafer 20 is configured as shown in FIG. 5(d). In FIG. 5(d), a large number of semiconductor devices 1 have been attached onto the dicing tape 32.

According to the embodiment described above, the following operational advantages can be achieved.

(1) The semiconductor element 10 has the mounting terminal 12 formed on a part of the terminal formation surface S by plating. Surfaces of the semiconductor element 10 except for the terminal formation surface S are sealed with the sealing resin 13. The mounting terminal 12 is electrically connected to a circuit in the semiconductor element 10. In this way, the thickness in the height direction of the semiconductor device 1 can be easily controlled. In particular, the mounting thickness of the semiconductor device 1 can be made thinner than that in conventional semiconductor devices.

(2) Ends of the bottom surface S of the semiconductor element 10 (ends of the insulating protective layer 16) and a surface of the sealing resin 13 are formed continuously, that is, they constitute a single plane. In this way, the semiconductor element 10 can be reliably sealed to have a high insulation ability. Further, side surfaces of the mounting terminals 12 are completely exposed without being buried in the sealing resin 13, so that the extremely thin mounting terminals 12 can be formed.

In a case where the mounting terminal 12 is formed by thin plating instead of solder balls having a certain height, a distance from a surface of the mounting terminal 12 to side surfaces of the semiconductor element 10 is small. Therefore, solder may extend to the side surfaces of the semiconductor element 10 when the mounting terminal 12 is soldered.

By sealing the side surfaces of the semiconductor element 10 with the sealing resin 13 as in the embodiment described above, occurrence of short circuit at the time of mounting due to extension of the solder can be avoided. Moreover, according to the manufacturing method in the embodiment described above, the side surfaces and the back surface of the semiconductor element 10 can be reliably sealed with the sealing resin having a uniform thickness. Furthermore, according to this manufacturing method, the thickness of the sealing resin 13 on the side surfaces can be easily controlled by changing a dicing width.

(3) The thickness from the bottom surface S of the mounting terminal 12 is 15 micrometers or less. In this way, the mounting thickness of the semiconductor device 1 can be made significantly thinner than that in conventional semiconductor devices having a thickness of approximately 50 micrometers, for example.

(4) The sealing resin 13 is cured and formed uniformly in a single step 11. In this way, resin sealing can be more robustly and rapidly performed compared with the conventional art as described in PTL1 and the like, in which sealing is formed by potting in separate steps.

(5) The sealing resin 13 is formed by vacuum lamination. In this way, the thickness of the sealing resin on the upper surface of the semiconductor device 1 can be more reliably controlled.

The following modifications are also included within the scope of the present invention, and one or more of the modifications may be combined with the above-described embodiment.

First Modification

A method of forming the mounting terminal 12 is not limited to the method according to steps 1 to 7 described above. For example, instead of steps 1 to 7, the mounting terminal 12 may be formed by a method described below.

Figure 6A:
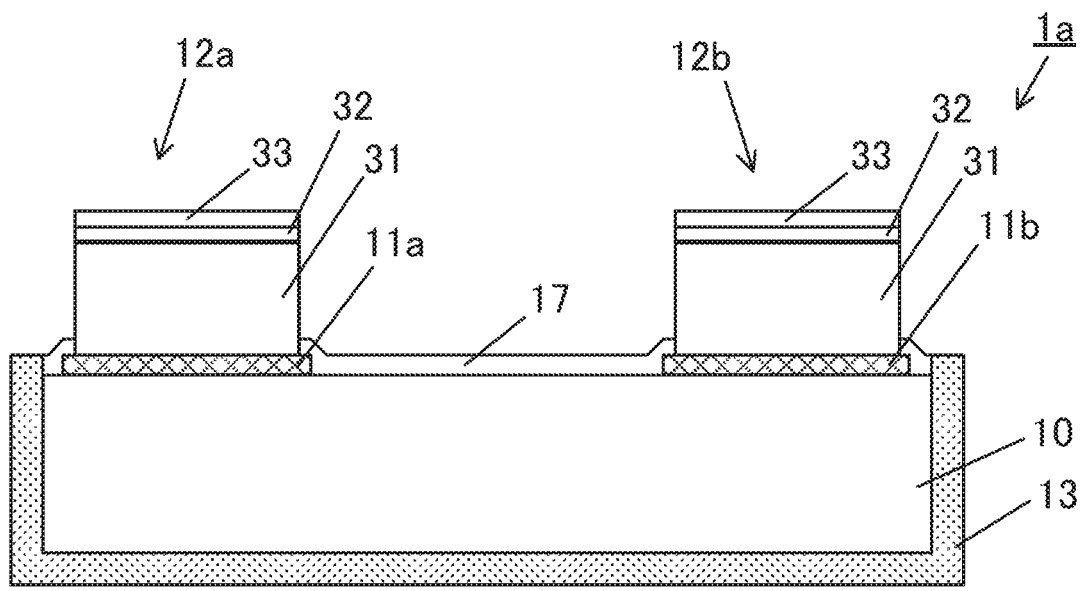
FIGS. 6A and 6B are cross-sectional views of a semiconductor device according to a modification.

In a semiconductor device 1a shown in FIG. 6(a), a mounting terminal 12 is formed by a method different from the method according to steps 1 to 7. First, a zincate treatment is performed on a pad 11 as a pretreatment for plating. Thereafter, a first conductive layer 31 of nickel (Ni) is formed on the pad 11 by electroless plating. A second conductive layer 32 of palladium (Pd) and a third conductive layer 33 of gold (Au) are sequentially formed thereon by electroless plating.

The thickness of the mounting terminal 12 as viewed from a surface of an insulating protective layer 16 is desirably 15 micrometers or less, and more preferably 10 micrometers or less, in order to reduce a mounting thickness of the semiconductor device 1. For example, such a thickness can be realized with the thickness of the first conductive layer 31 of approximately 8 micrometers and the thickness of the second conductive layer 32 and the third conductive layer 33 of approximately 0.05 micrometers.

Forming the mounting terminal 12 in this way can facilitate a control of the thickness of the mounting terminal in a smaller number of steps than that in the case of using the method according to steps 1 to 7.

Figure 6B:
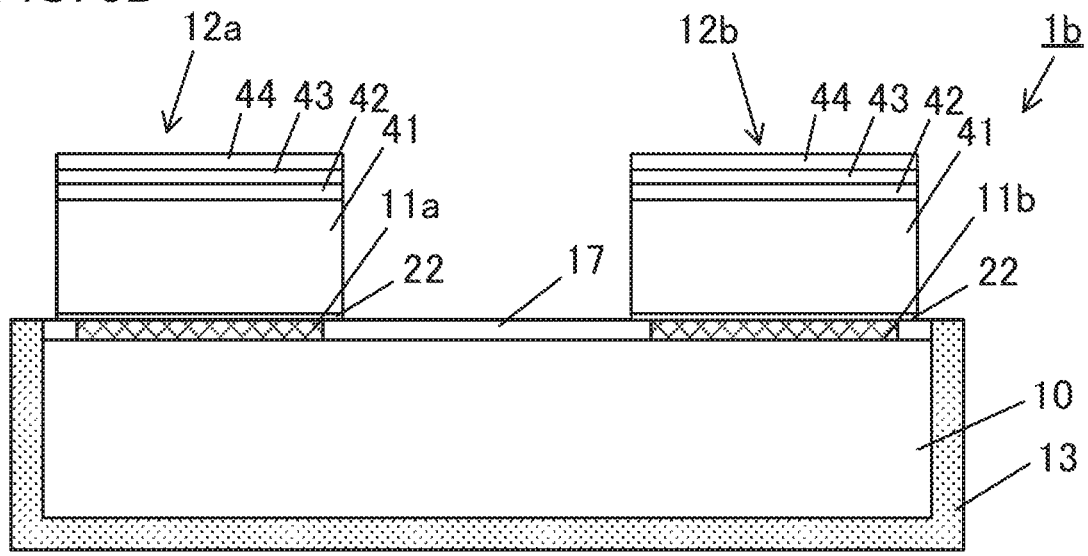

In a semiconductor device 1b shown in FIG. 6(b), a mounting terminal 12 is formed by a method different from the method according to steps 1 to 7. First, a sputtering process using high frequency power is performed as pretreatment to remove an oxide film or the like on the surface of a pad 11. Thereafter, as in step 2, a seed layer 22 of titanium (Ti), copper (Cu), or the like is formed by sputtering or the like. A first conductive layer 41 of nickel (Ni) is formed thereon by electroplating. A second conductive layer 42 of nickel (Ni), a third conductive layer 43 of palladium (Pd), and a fourth conductive layer 44 of gold (Au) are sequentially formed on the first conductive layer 41 by electroless plating. Then, as in step 7, the exposed seed layer 22 is removed by etching.

The thickness of the mounting terminal 12 as viewed from a surface of an insulating protective layer 16 is desirably 15 micrometers or less, and more preferably 10 micrometers or less, in order to reduce a mounting thickness of the semiconductor device 1. For example, such a thickness can be realized with the thickness of the first conductive layer 41 of approximately 7 micrometers, the thickness of the second conductive layer 42 of 1 micrometer, and the thickness of the third conductive layer 43 and the fourth conductive layer 44 of approximately 0.05 micrometers.

Forming the mounting terminal 12 in this way can facilitate a control of the thickness of the mounting terminal even if electroless plating cannot be directly performed on the pads 11.

Note that the third conductive layer 43 may be omitted.

Although the embodiment and modifications of various types have been described above, the present invention is not limited to these. Other embodiments contemplated within the scope of the technical idea of the present invention are also included within the scope of the present invention.

The disclosure of the following priority application is herein incorporated by reference:
Japanese Patent Application No. 2017-106608 (filed on May 30, 2017)

REFERENCE SIGNS LIST 1, 1a, 1b ... semiconductor device, 10 ... semiconductor element, 11, 11a, 11b ... pad, 12, 12a, 12b ... mounting terminal, 13 ... sealing resin, 14, 31, 41 ... first conductive layer, 15, 32, 42 ... second conductive layer, 16 ... insulating protective layer, 17 ... passivation film, 18 ... protective film, 22 ... seed layer, 33, 43 ... third conductive layer, 44 ... fourth conductive layer

The invention claimed is:

1. A semiconductor device comprising:
a semiconductor element having a pad electrically connected to internal circuits of the semiconductor element and a plated portion on a part of a main surface;
an insulating protective layer covering the main surface and having an opening through which the pad is exposed; and
a protective member that seals surfaces of the semiconductor element except for the main surface, wherein:
the insulating protective layer includes a passivation film and a protective film made of a resin and formed on the passivation film;
the opening is formed inside a periphery of the pad;
the protective member is formed continuously to the insulating protective film and covers at least a part of a side surface of the insulating protective layer around ends of the main surface;
the plated portion is a mounting terminal connected to the pad through the opening of the protective film;
the mounting terminal is formed by stacked plated layers and is sticking out of a top surface of the protective film, and
a surface of the protective member and an outer surface of the protective film are flush with each other around the ends of the main surface.

2. The semiconductor device according to claim 1, wherein:
a thickness of the plated portion from a surface of the insulating protective layer is 15 micrometers or less.

3. The semiconductor device according to claim 1, wherein:
the protective member is a uniform thermosetting resin with a thickness of 30 micrometer or less on a surface opposite to the main surface.

4. The semiconductor device according to claim 3, wherein:
the protective member includes a predetermined filler.

5. A method of manufacturing a semiconductor device comprising:
forming a plated portion on a part of a main surface of semiconductor elements formed on a wafer, each of the semiconductor elements having a pad electrically connected to internal circuits, the plated portion being electrically connected to the pad; and
sealing surfaces of the semiconductor element except for the main surface, with a protective member, wherein:
the forming of the plated portion includes forming an insulating protective layer which covers the main surface of the semiconductor elements of the wafer and has an opening through which the pad is exposed;
the forming of the insulating protective layer includes forming a passivation film on the main surface of the semiconductor elements of the wafer and a protective film formed on the passivation film and made of a resin, wherein an opening of the insulating protective layer and an opening of the protective film are arranged inside a periphery of the pad;
after cutting the wafer for separating the semiconductor elements, the protective member is formed continuously to the insulating protective film for covering at least a part of a side surface of the insulating film around ends of the main surface;

the plated portion is formed as a mounting terminal connected to the pad through the opening of the protective film;

the mounting terminal is formed by stacking plated layers and sticking out of a top surface of the protective film, and a surface of the protective member and an outer surface of the protective film are flush with each other around the ends of the main surface.

6. The method of manufacturing a semiconductor device according to claim 5, wherein:

the plated portion is formed to have a thickness of 15 micrometers or less from a surface of the insulating protective layer.

7. The method of manufacturing a semiconductor device according to claim 5, wherein:

a thermosetting resin is cured in a single process to form the protective member with a thickness of 30 micrometer or less on a surface opposite to the main surface.

8. The method of manufacturing a semiconductor device according to claim 7, wherein:

the thermosetting resin containing a predetermined filler is used for the protective member.

9. The method of manufacturing a semiconductor device according to claim 5, wherein:

the protective member is formed by covering surfaces except for the main surface of the semiconductor element with a film-like thermosetting resin by vacuum lamination, and heating thermosetting resin.

10. A method of manufacturing a semiconductor device comprising:

preparing a wafer in which semiconductor elements are formed, each of the semiconductor elements having a pad connected to internal circuits;

forming a protective film on a passivation film on a main surface of the semiconductor elements formed in the wafer;

forming a plated portion connecting to the pad;

cutting the wafer for separating the semiconductor elements one another after the plated portion is formed; and sealing surfaces of the separated semiconductor elements except for the main surface, with a protective member, wherein:

the protective member is formed continuously to the insulating protective film for covering at least a part of a side surface of the insulating film around ends of the main surface;

the plated portion is formed by stacking plated layers and sticking out of a top surface of the protective film, and a surface of the protective member and an outer surface of the protective film are flush with each other around the ends of the main surface.

11. The method of manufacturing a semiconductor device according to claim 10, further comprising:

forming an opening, where the protective film is not formed, in the protective film inside a periphery of the pad.

12. The method of manufacturing a semiconductor device according to claim 10, wherein:

the plated portion is formed to have a thickness of 15 micrometers or less from a surface of the insulating protective layer.

13. The method of manufacturing a semiconductor device according to claim 10, wherein:

a thermosetting resin is cured in a single process to form the protective member with a thickness of 30 micrometer or less on a surface opposite to the main surface.

14. The method of manufacturing a semiconductor device according to claim 13, wherein:

the thermosetting resin containing a predetermined filler is used for the protective member.

15. The method of manufacturing a semiconductor device according to claim 10, wherein:

the protective member is formed by covering surfaces of the semiconductor element, except for the main surface, with a film-like thermosetting resin by vacuum lamination, and heating thermosetting resin.

* * * * *